United States Patent [19]
Sadler et al.

[11] Patent Number: 5,841,635
[45] Date of Patent: Nov. 24, 1998

[54] FLEXIBLE PRINTED CIRCUIT FOR SPLIT KEYBOARD AND METHOD OF ASSEMBLY

[75] Inventors: John T. Sadler; Thomas D. Snyder; Jason D. Mareno, all of Raleigh, N.C.

[73] Assignee: Ericsson, Inc., Research Triangle Park, N.C.

[21] Appl. No.: 939,543

[22] Filed: Sep. 29, 1997

[51] Int. Cl.⁶ .............................. H05K 05/03; G06F 01/16
[52] U.S. Cl. ..................... 361/749; 361/680; 361/681; 400/82; 400/489; 400/682; 400/691; 312/208.1; 312/208.4; 235/145 A; 345/168; 345/169; 364/708.1; 439/165; 200/5 A; 200/512; 200/61.7
[58] Field of Search ...................... 361/749, 680, 361/683, 686, 687, 101; 400/82, 88, 489, 682, 691, 692, 693; 312/208.1, 208.4; 235/145 A; 345/168, 169, 905; 364/708.1; 248/917; 341/22; 439/31, 165, 15; 200/5 A, 512, 61.7

[56] References Cited

U.S. PATENT DOCUMENTS

| | | | |
|---|---|---|---|
| 4,696,523 | 9/1987 | Schauer et al. | 439/11 |
| 4,824,396 | 4/1989 | Sasaki et al. | 439/475 |
| 4,838,803 | 6/1989 | Kondo | 439/164 |
| 4,885,430 | 12/1989 | Kinser Jr. et al. | 174/254 |
| 5,122,786 | 6/1992 | Rader | 340/711 |
| 5,198,991 | 3/1993 | Pollitt | 364/708 |
| 5,210,378 | 5/1993 | Tusques | 174/117 F |
| 5,267,127 | 11/1993 | Pollitt | 361/680 |
| 5,424,728 | 6/1995 | Goldstein | 341/22 |
| 5,457,453 | 10/1995 | Chiu et al. | 341/22 |
| 5,574,481 | 11/1996 | Lee | 345/168 |
| 5,596,480 | 1/1997 | Manser et al. | 361/680 |
| 5,612,691 | 3/1997 | Murmann et al. | 341/22 |
| 5,653,543 | 8/1997 | Abe | 400/489 |
| 5,712,760 | 1/1998 | Coulon et al. | 361/680 |
| 5,734,548 | 3/1998 | Park | 361/680 |

FOREIGN PATENT DOCUMENTS

| | | |
|---|---|---|
| 0 248 156 A | 12/1987 | European Pat. Off. . |
| 0 671 751 A | 9/1995 | European Pat. Off. . |
| 295 02 877 U | 7/1995 | Germany . |
| 02 295 850 A | 6/1996 | United Kingdom . |

*Primary Examiner*—Leo P. Picard
*Assistant Examiner*—David Foster
*Attorney, Agent, or Firm*—Jenkens & Gilchrist, P.C.

[57] ABSTRACT

Relatively moveable portions of a flexible printed circuit member are interconnected by a web that extends between the moveable portions and is disposed in a cavity within a hinge interconnecting separately moveable parts of a split keypad assembly. The web portion of the flexible printed circuit is folded so that it is coaxially aligned with the axis of rotation of the moveable portions of the keypad assembly. The design and arrangement of the flexible printed circuit member avoids bending the flexible printed circuit member about an axis perpendicular to the member when the keypad assembly is opened or closed, and provides a vertically assemblable structure that completely encloses the interconnecting web portion of the printed circuit member, thereby avoiding the need for external connectors between the moveable elements of the keypad assembly.

12 Claims, 7 Drawing Sheets

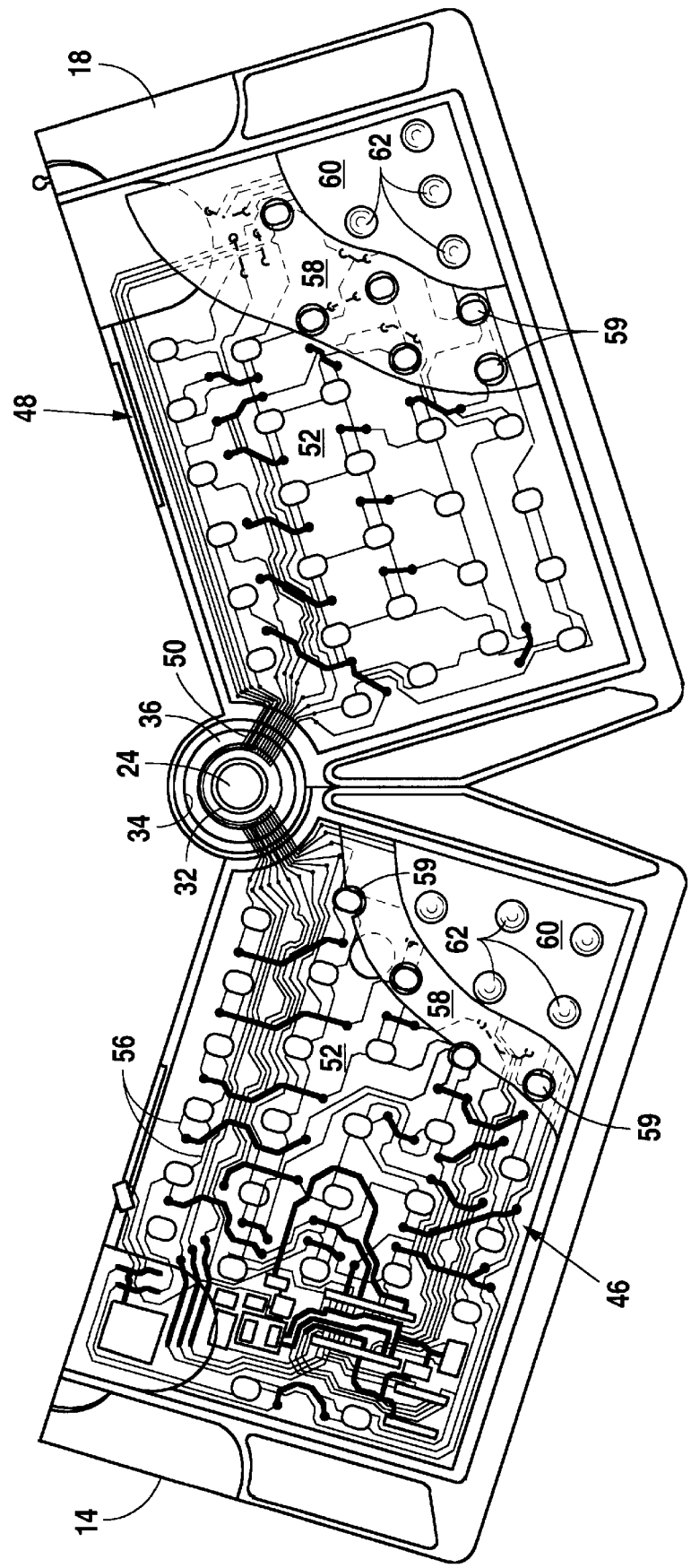

FLEXIBLE PRINTED CIRCUIT FOR SPLIT KEYBOARD AND METHOD OF ASSEMBLY

BACKGROUND OF THE INVENTION

1. Technical Field

This invention relates generally to a flexible circuit member having separately moveable portions that are rotatable within a plane and are interconnected by a web portion that is disposed about an axis perpendicular to the planar motion of the separately moveable portions, and more particularly to such a printed circuit member that is suitable for use in an instrument having a split keyboard.

2. History of Related Art

Many electronic instruments, such as personal organizers, personal digital assistants (PDAs), cellular telephones, small computers, web site TVS and other data storage, transmitting or receiving instruments have separate printed circuit boards (PCBs) mounted in relatively moveable components of the instrument. The relatively moveable components are generally interconnected by a hinge which permits the components to be moved between open and closed positions. Currently, there is no satisfactory way to run a circuit through a compact hinge when the hinge axis is perpendicular to the printed circuit boards of the moveable components. Many products run wires external to the hinge, with a connector provided on each of the printed circuit boards and on the ends of the wire or cable routed external to the hinge. Other solutions include a flexible circuit which bends along the axis of the hinge, subjecting the circuit to repeated bending stress and early failure. Other solutions include sliding contacts provided within the hinge that are connected to a separate circuit board in each of the relatively moveable components.

All of the above arrangements have inherent disadvantages. For example, interconnecting cables can be bulky if a significant number of leads, or wires, are needed and, if disposed externally of the hinge, are subject to damage and wear. Also, if separate circuit boards are provided, the separate circuits, cable assembly, and connectors are individual subassemblies that require separate fabrication and assembly, adding to the cost of the instrument.

The present invention is directed to overcoming the problems set forth above. It is desirable to have a single circuit member that has separate relatively moveable portions that can be disposed in relatively moveable components of an instrument. It is further desirable to have such a single circuit member that has a web portion interconnecting the portions disposed in each of the moveable members. Furthermore, it is desirable to have such a flexible circuit member that can be positioned in a manner that avoids bending of the web portion of the member during movement of the relatively moveable components of the instrument. Moreover, it is desirable to have such a flexible printed circuit member that is easy to manufacture and assemble and provides a single, reliable electrical circuit that has low electrical resistance due to the elimination of electrical connectors and an interconnecting cable.

SUMMARY OF THE INVENTION

In accordance with the one aspect of the present invention, a flexible printed circuit member has first and second planar portions disposed in parallel planes and moveable within the respective parallel planes about an axis perpendicular to the parallel planes. The flexible printed circuit member also has a web portion extending between the first and second planar portions that has at least a portion disposed around the perpendicular axis and in perpendicular relationship with the parallel planes of the first and second planar portions.

Other features of the flexible printed circuit member, embodying the present invention, include the first and second planar portions of the flexible printed circuit member being coplanarly disposed in a common plane and moveable between a closed position at which the first and second planar portions are adjacently disposed within the common plane, and an open position at which the first and second planar portions are pivotally rotated within the common plane to a position away from the adjacent disposition. The web portion of the flexible printed circuit member is disposed about the perpendicular axis in spaced relationship therefrom at a first distance when the first and second planar portions are at the closed position, and disposed about and spaced from the perpendicular axis at a second distance different from, i.e., either less than or greater than, the first distance when the first and second planar portions are at the open position.

Still other features of the flexible printed circuit member include the first and second portions of the flexible circuit member being respectively disposed within first and second housings that are planarly rotatable within the common plane and are interconnected by a hinge assembly disposed perpendicular to the axis perpendicular to the common plane. An annular cavity is provided within the hinge assembly and the web portion of the flexible printed circuit member is disposed within the annular cavity.

In another aspect of the present invention, a keypad assembly includes a first keypad portion mounted in a first housing and a second keypad portion mounted in a second housing, each of the housings being disposed in mutually parallel planes and pivotally interconnected together for a rotation about an axis perpendicular to the parallel planar disposition of the housings. The keypad assembly also includes a flexible circuit member having a first planar portion disposed in the first housing, a second planar portion disposed in the second housing, and a web portion extending between the first and second planar portions. At least a portion of the web is disposed about an axis perpendicular to the planar disposition of the housings, in an annular cavity provided in a hinge interconnecting the first and second housings.

Other features of the keypad assembly include the first and second portions and the web portion of the flexible member each comprising a base layer having a plurality of electrically conductive circuit features disposed thereon. Furthermore, the first and second planar portions include a spacer layer, formed of a non-conductive flexible film, disposed in covering relationship over the base layer, and an upper layer disposed over the spacer layer in adjacent relationship with the respective first and second keypad portions of the keypad assembly. The upper layer of each of the first and second planar portions of the flexible circuit member also includes a plurality of key actuatable switches.

BRIEF DESCRIPTION OF THE SEVERAL VIEWS OF THE DRAWINGS

A more complete understanding of the structure and operation of the present invention may be had by reference to the following detailed description when taken in conjunction with the accompanying drawings, wherein:

FIG. 4 is a plan view of the flexible circuit member, embodying the present invention, showing the flexible circuit member and housings in an open position;

DETAILED DESCRIPTION OF A PRESENTLY PREFERRED EXEMPLARY EMBODIMENT

The present invention solves the problem of connecting a circuit through a hinge in a way that contains and protects the circuit, minimizes the size of a hinge, and eliminates multiple circuit boards and connectors. Printed circuits are commonly used in portable instruments that, because of size limitations, comprise multiple components that are folded with respect to each other when in a closed position, and then opened to an operable position. The present invention uses a flexible printed circuit member that is folded in such as way as to allow more electrical traces, or leads, per volume through the hinge than in previous designs, and in such a way that the interconnecting portion of the flexible circuit fits wholly within a tightly compacted hinge.

Figure 1:
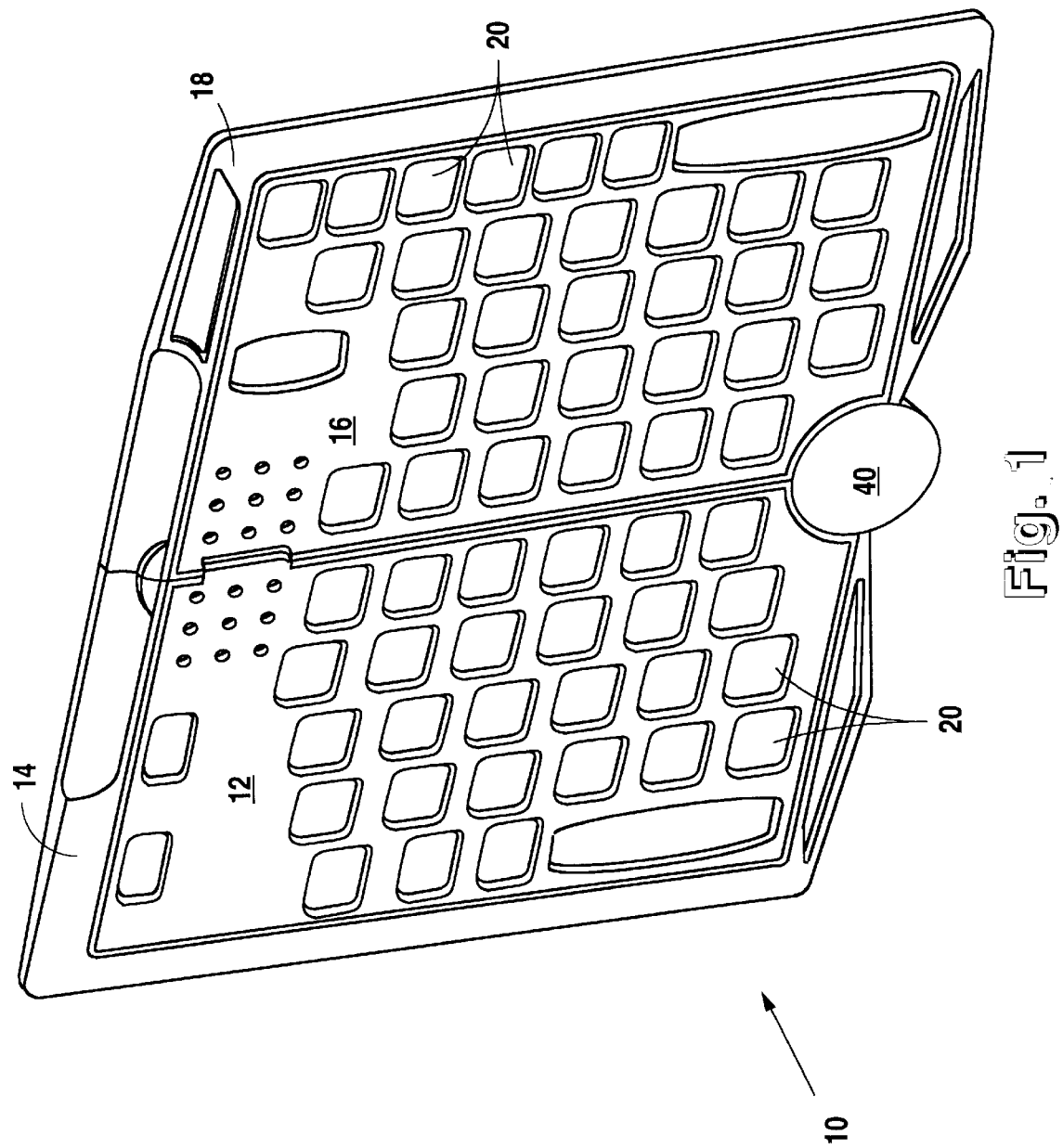
FIG. 1 is a plan view, in perspective, of a foldable keyboard, embodying the present invention, showing the keyboard in a closed position.
Figure 2:
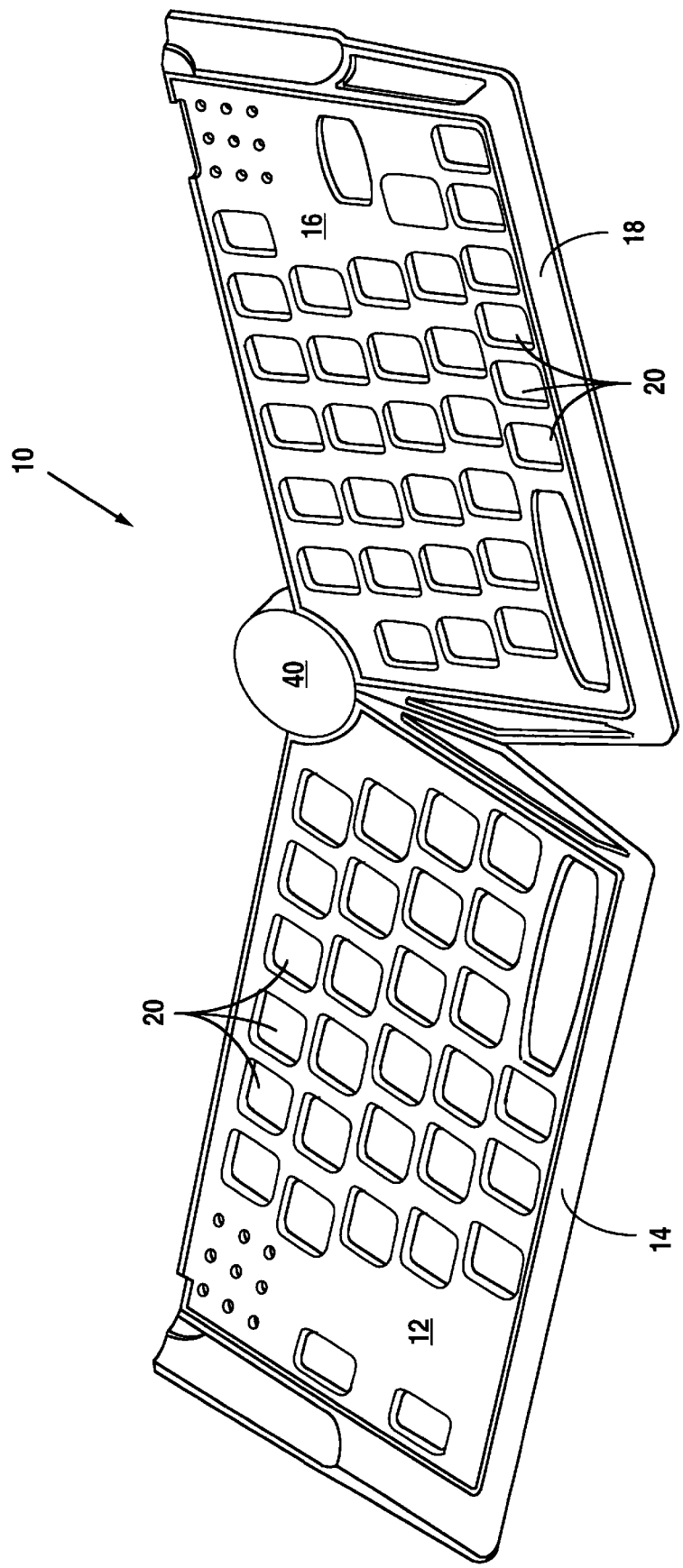
FIG. 2 is a plan view, in perspective of the foldable keyboard, embodying the present invention, showing the keyboard in an open position.
Figure 3:
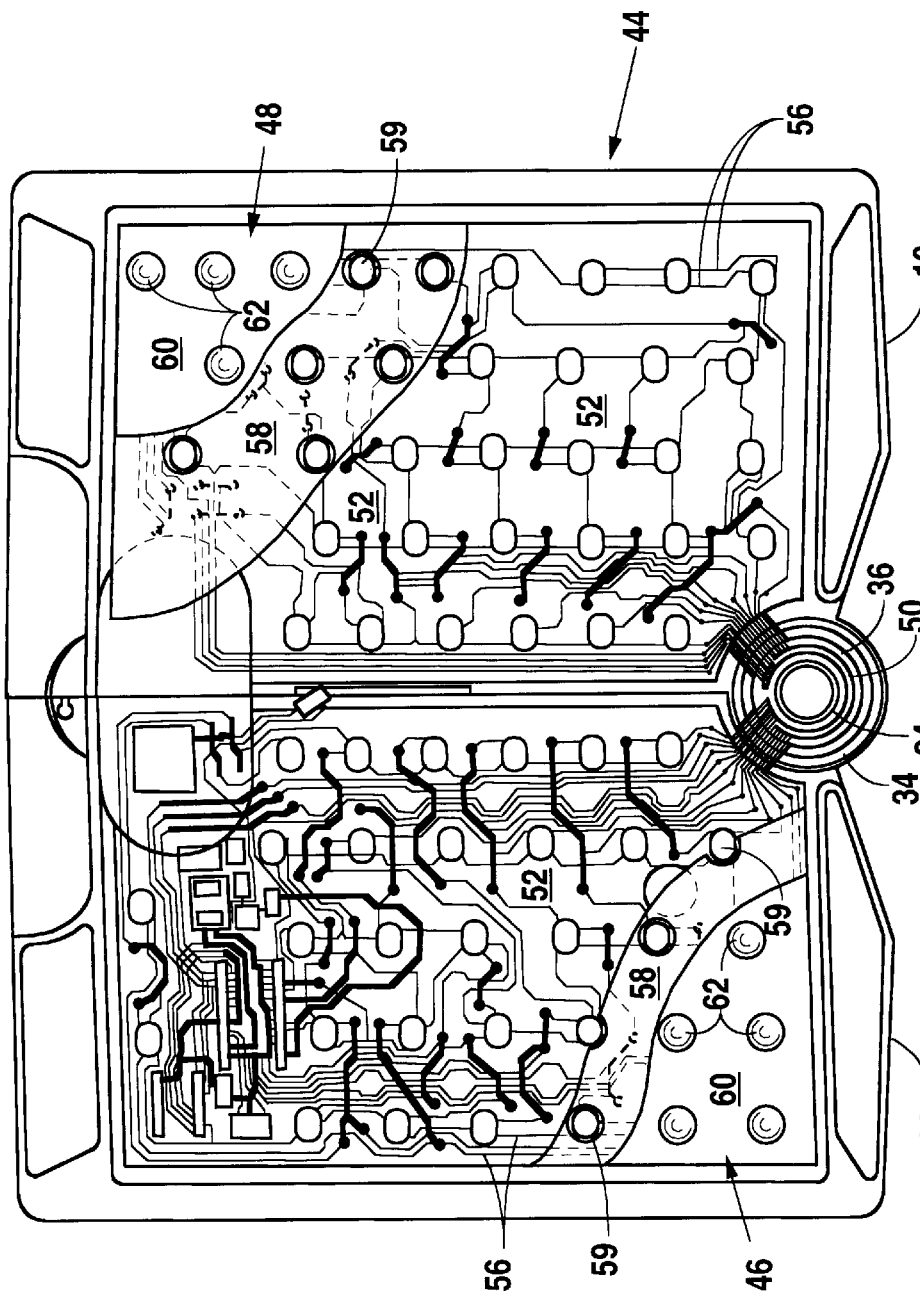
FIG. 3 is a plan view of a flexible circuit member, embodying the present invention, showing the flexible circuit member and housings for the member in a closed position.

As shown in FIGS. 1 and 2, a keypad assembly 10 embodying the present invention, has a first keypad portion 12 mounted in a first housing 14 and a second keypad portion 16 mounted in a second housing 18. In the illustrated exemplary embodiment, the keypad assembly 10 is adapted for use as a foldable keyboard in a relatively small and compact data entry, storage and/or retrieval device, such as a telecommunication instrument having keypad input capability. Each of the keypad portions 12, 16 have a plurality of keys 20 that, in the illustrated exemplary embodiment, are arranged in a standard keyboard layout, with the left half of the standard keyboard layout being disposed in the first keypad portion 12, and the right half of the standard keypad layout being disposed in the second keypad portion 16 of the keypad assembly 10.

Desirably, the first and second housings 14, 18, comprise an upper portion through which the keys 20 extend, and a lower portion into which the upper portion is assembled by snap engagement or other retention means. As shown in FIGS. 1–5, each of the housings 14, 18, are coplanarly disposed with respect to each other and pivotally interconnected together for rotation about an axis 22 that is perpendicular to the planar disposition of the housings 14, 18. In an alternative arrangement, the first and second housings 14, 18 may be disposed in offset parallel planes.

Figure 6:
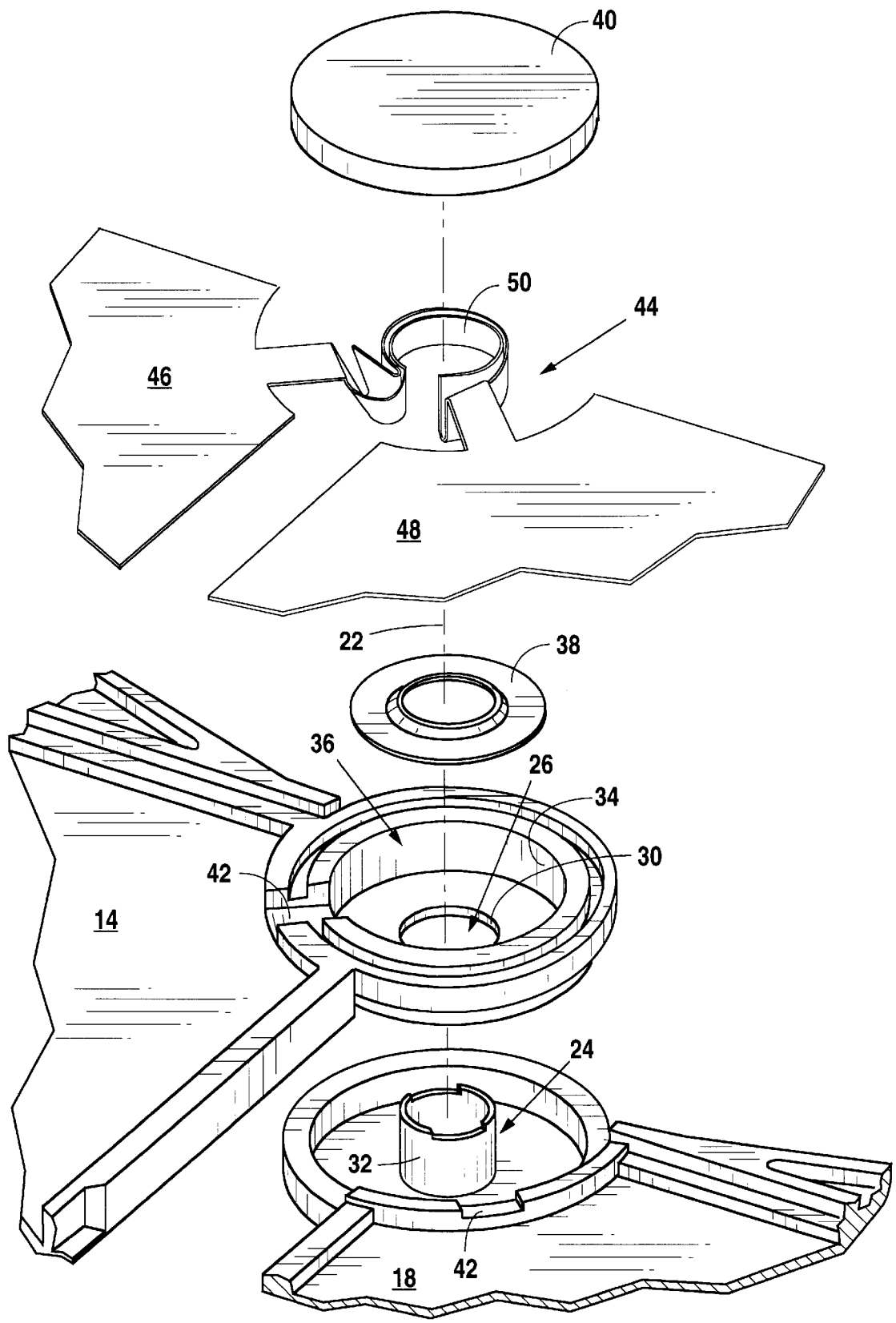
FIG. 6 is an enlarged three-dimensional view of the keyboards and the flexible circuit member showing details of the hinge assembly in which the web portion of the flexible circuit member is housed.

As best shown in FIGS. 6, the second housing 18 has a hollow stub shaft 24 having an outer cylindrical surface 32 that is coaxially disposed with respect to the perpendicular axis 22. The first housing 14 has a circular opening 26 that is coaxially disposed about the perpendicular axis 22. In the preferred embodiment, the circular opening 26 is defined by an internal cylindrical surface 30 adapted to mate with the outer cylindrical surface 32 of the stub shaft 24. The first housing 14 further includes an annular wall 34, coaxially disposed about the axis 22 and radially spaced outwardly from the outer cylindrical surface 32 of the stub shaft 24. The annular wall 34 cooperates with the outer cylindrical surface 32 of the stub shaft 24 to at least partially define an annular cavity 36.

The hinge connection between the first and second housings 14, 16 further includes a retainer ring 38, having an internal diameter adapted to provide an interference fit with the outer cylindrical surface 32 of the stub shaft 24, that is pressed over the stub shaft 24 after the first housing 14 is assembled with the second housing 18, to retain the housings 14, 18 in a pivotally rotatable relationship about the perpendicular axis 22, but axially fixed with respect to each other along the axis 22. A hinge cap 40 is adapted to snap over the open end of the stub shaft 24, completing a hinge assembly with the annular cavity 36 fully defined within the hinge assembly. Each of the housings 14, 18 have a relief notch 42 communicating between the respective housings 14, 18 and the annular cavity 36.

Importantly, the keypad assembly 10 embodying the present invention includes a unitary, flexible printed circuit member 44 having a first planar portion 46 disposed within the first housing 14, a second planar portion 48 disposed within the second housing 18, and a web portion 50 partially disposed, as described below in greater detail, within the annular cavity 36 of the hinge assembly. More specifically, the first and second planar portions 46, 48 of the flexible printed circuit member 44 are disposed in the same plane as the first and second housings 14, 18 of the keypad assembly 10, i.e., either in mutually parallel planes, or coplanarly in a common plane. Thus, the first and second planar portions 46, 48 of the flexible printed circuit member 44 are moveable relative to each other, about the perpendicular axis 22.

In the preferred embodiment, the first and second planar portions 46, 48, and the web portion 50 of the flexible printed circuit member 44 each have a base layer 52 on which electrically conductive circuit features 56, such as conductive pads and traces, are disposed. The base layer 52 is preferably formed of a non-conductive flexible plastic film, such as polyester. The base layer 52, with the electrically conductive circuit features disposed thereon, also extends through the web portion 50 and provides electrical communication between the first planar portion 46 and the second planar portion 48.

Figure 5A:
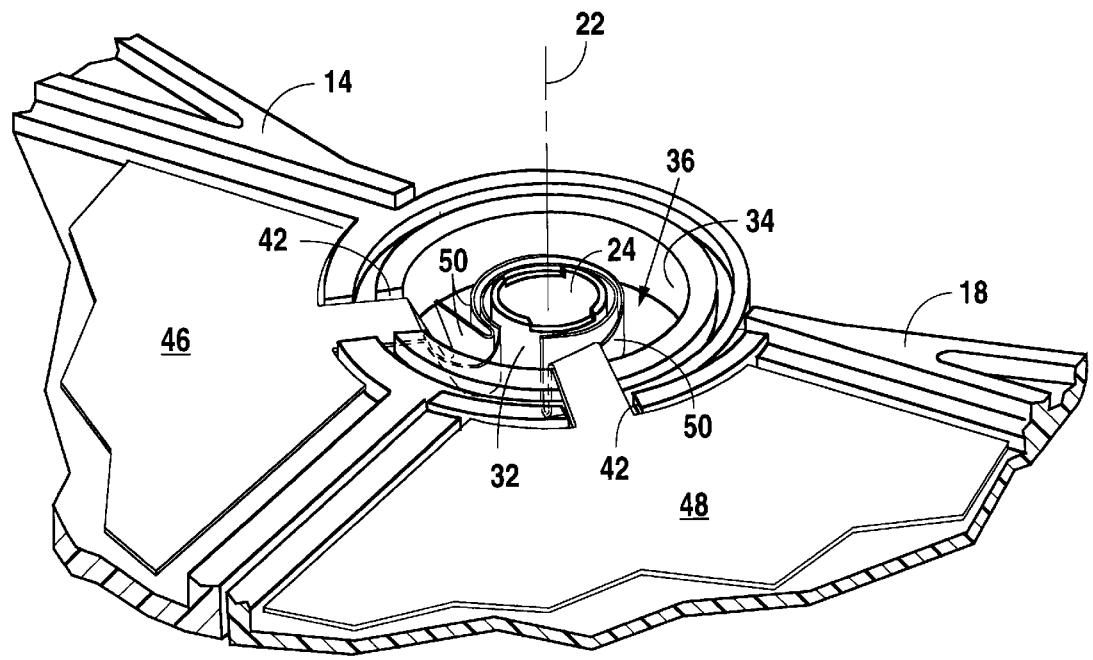
FIG. 5a is an enlarged three-dimensional view of the web portion of the flexible circuit member, showing the position of the web when the keyboard is at a closed position.
Figure 5B:
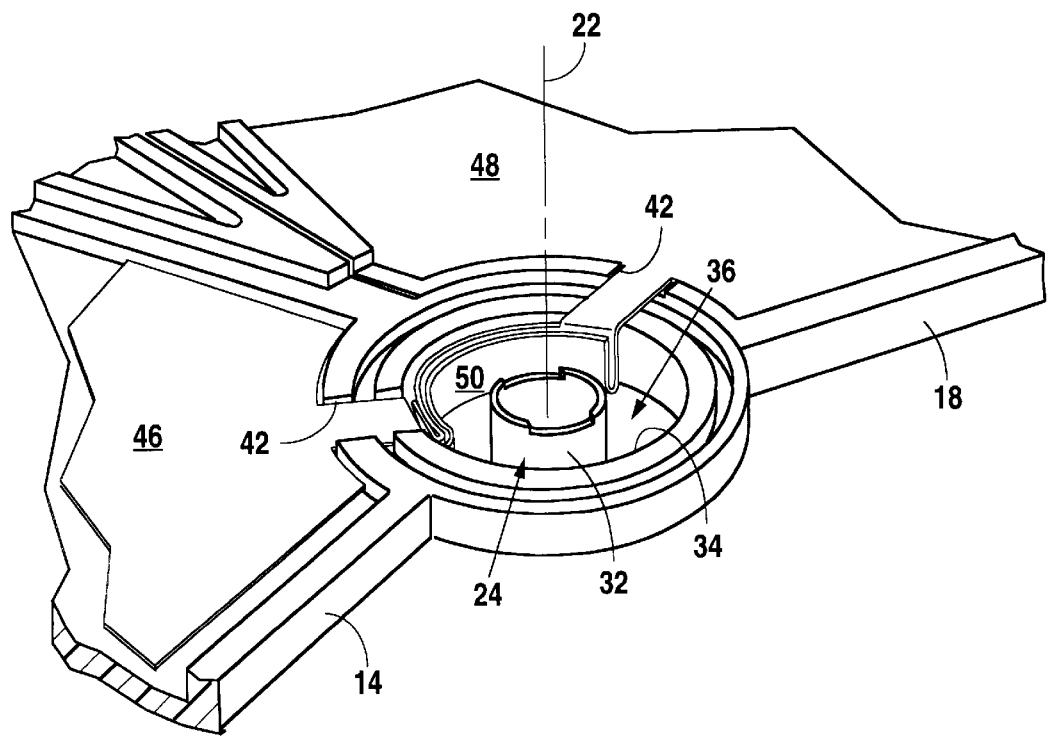
FIG. 5b is an enlarged three-dimensional view of the web portion of the flexible circuit member, showing the position of the web when the keyboard is at an open position.

As best shown in FIG. 5, an elongated central portion of the web 50 having a length greater than its width, is folded over once along the length of the central portion so that when the flexible printed circuit member 44 is installed in the keypad assembly 10, the folded central portion of the web 50 is disposed within the annular cavity 36 in circumjacent relationship about the perpendicular axis 22, and in spaced relationship from the axis 22. In other arrangements, the central portion of the web 50 may be folded longitudinally in a reverse direction, i.e. upwardly rather than downwardly, from that shown in FIG. 5. Also, if a large number of circuits are included in the web 50, requiring a wider web 50, the web portion 50 may be folded along more than one longitudinal axis parallel to the single axis shown in the drawings. The folded arrangement of the central portion of the web 50 reduces the height of the central portion, permitting a more compact hinge arrangement while increasing the number of circuit traces that can be routed through the web 50. Furthermore, as described above, the central portion of the web 50 may also be coated with a thin non-conductive film or electrically-insulative tape to prevent inadvertent contact between exposed electrically conductive elements of the electrical circuits 56.

The central portion of the web 50 is thus oriented in perpendicular relationship with the above-described rotational plane or planes, of the first and second housings 14, 18 and, accordingly, is perpendicular to the plane of movement of each of the first and second planar portions 46, 48 of the flexible printed circuit member 44. More specifically, each end of the web portion 50, adjacent a respective one of the first and second planar portions 46, 48 extends through a respective notch 42 and then bends downwardly 90°. The respective traces 56 then turn 90° and run parallel with the web 50 through the folded central portion of the web 50. Advantageously, the electrical traces within the web portion 50 may be equally distributed between each of the longitudinally folded plicae of the web portion 50.

A spacer layer 58, also formed of a non-conductive flexible plastic film, such as polyester, is disposed in covering relationship over the base layer 52 in the first and second planar portions 46, 48 of the flexible printed circuit member 44. A plurality of apertures 59 extend through the spacer layer 58, allowing direct electrical interconnection between switches or other components mounted on an upper layer 60 and the predefined circuit features on the base layer 52. If desired, the spacer layer 58 may also extend over the base layer 52 in the web portion 50 of the flexible printed circuit member 44. Alternatively, an electrically nonconductive adhesive tape may be applied over the base layer 52 through the web portion 50 to prevent contact between exposed circuit features.

In the first and second planar portions 46, 48 of the member 44, the flexible printed circuit member 44 also includes the upper layer 60. The upper layer 60 is desirably formed of a relatively thin, flexible, non-conductive plastic film, such as the aforementioned polyester film and, in the preferred embodiment, has a plurality key-actuatable switch 62 e.g., polydomes, embossed therein at aligned positions directly below each of the keys 20 of the respective first and second keypad portions 12, 16. The key-actuatable switches 62 may be any of several well known key-actuated switch arrangements. In the illustrative exemplary embodiment of the present invention, the key-actuatable switches are conventional polydome switches 62, one of which is positioned immediately below each of the keys 20. Each of the polydomes 62 have a height of about 0.50 mm, a spherical radius of about 12.7 mm, and a diameter of 7 mm. The underside, or base, of each of the polydome switches 62 has an electrically conductive carbon-silver pad which, when brought into contact with an aligned electrically conductive element on the base layer 52, closes the circuit controlled by a corresponding key 20 of the keypad assembly 10.

In the illustrative exemplary embodiment, the base layer 52 of the flexible printed circuit member 44 has a thickness of about 0.75 $\mu$m, the spacer layer 58 also has a thickness of about 75 $\mu$m, and the upper circuit layer has a thickness of about 1.00 $\mu$m. Thus, in the exemplary embodiment, the overall thickness of the printed circuit member 44 is relatively thin, having a total thickness of only about 2.5 $\mu$m.

Thus, it can be seen, that when the first and second keypad portions 12, 16 are moved between the closed and open positions, the first and second planar portions 46, 48 of the flexible printed circuit member 44 are likewise moved coplanarly about the perpendicular axis 22. In the illustrated embodiment shown in FIGS. 3–5a,b, when the first and second planar portions 46, 48 are moved from the closed to the open position, the respective ends of the web portion 50 are moved farther apart. The folded central portion of the web 50 thus moves within the annular cavity 50 from a position at which the central portion of the web 50 is circumjacently disposed about the axis 22 at a radial position relatively closely spaced from the axis 22 when at the closed position, to a position spaced radially outwardly from the perpendicular axis when the first and second planar portions 46, 48 are moved to the open position. That is, the web portion 50 is disposed about the perpendicular axis 22 at a first distance when the first and second planar portions 46, 48 are at the closed position, and spaced from the perpendicular axis 22 at a second distance greater than the first distance when the first and second planar portions 46, 48 are at the open position.

Alternatively, the central portion of the web 50 may be routed around the opposite side of stub shaft 24. In the alternative arrangement, the central portion of the web 50 is disposed adjacent to the outer cylindrical surface 32 of the shaft 24 when the first and second planar portions 46, 48 of the flexible circuit member 44 are at the open position, and spaced from the cylindrical surface 32 of the shaft 24 when the first and second planar portions 46, 48 are at the closed position. Thus, in the alternative arrangement, the second position of the central portion of the web 50, when the planar portion 46, 48 are at the open positions, is less than the first distance at which the central portion of the web 50 is disposed when the planar portion 46, 48 are closed.

The construction of the keypad assembly 10, embodying the present invention permits the components of the assembly to be easily assembled vertically. More specifically, as described in flow chart form in FIG. 7, the first housing 14, having the circular opening 26 disposed in the predefined plane of the housing 14 and mateable with the outer cylindrical surface 32 of the shaft 24, on the second housing 18, is provided as indicated at block 70 in FIG. 7. In like manner, the second housing 16, having the perpendicular stub shaft 24 formed thereon in perpendicular relationship to the predefined plane, is provided as indicated at block 72.

Figure 7:
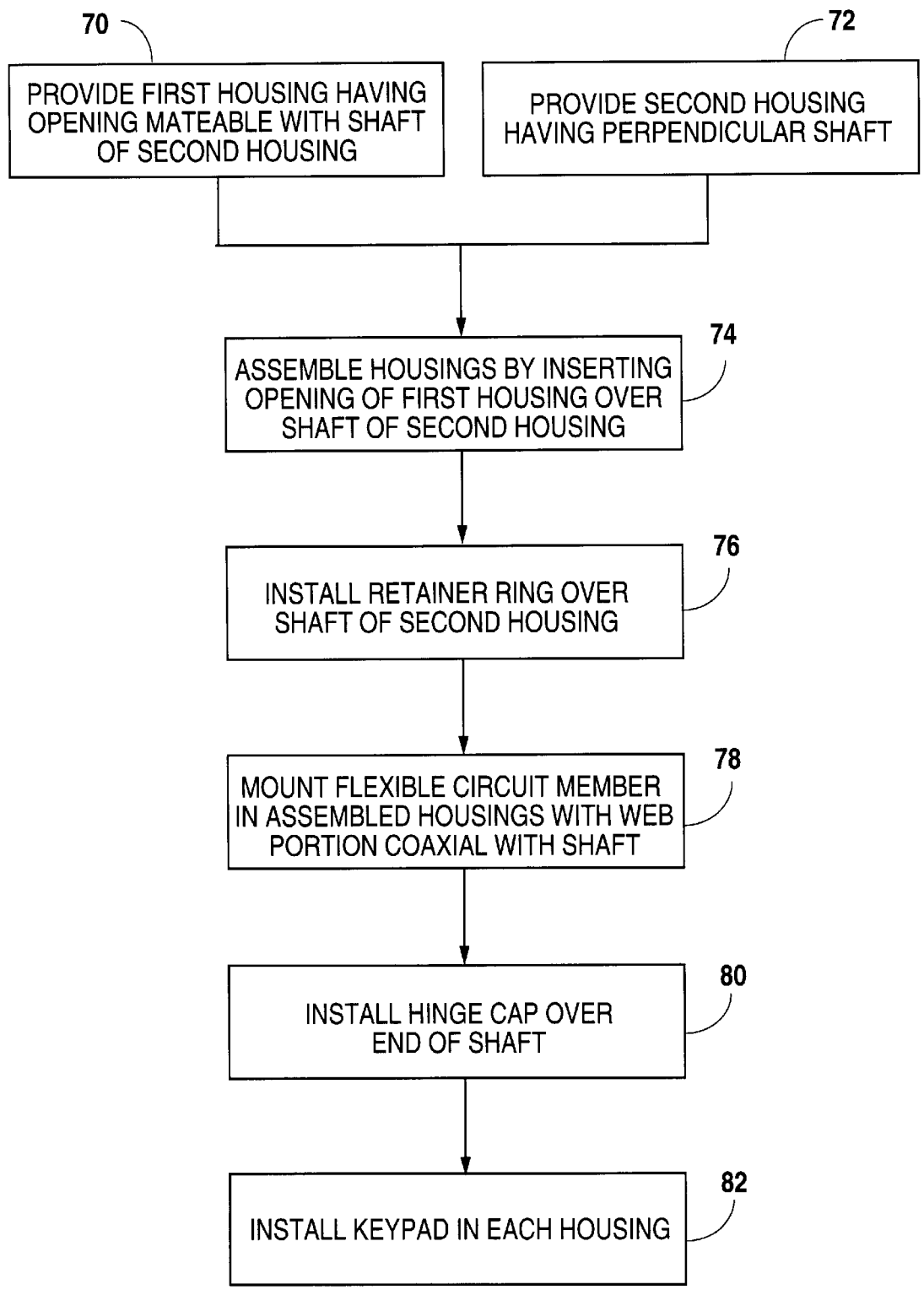
FIG. 7 is a block diagram of the principal steps carried out in the assembly of the keypad assembly embodying the present invention.

The first and second housings 14, 18 are assembled together, as represented by block 74 in FIG. 7, by inserting the opening 26 of the first housing 14 downwardly over the stub shaft 24 of the second housing 18. The retainer ring 38 is then pressed downwardly over the stub shaft 24, as indicated at block 76, to maintain the first and second housings 46, 48 in respective pivotally rotatable relationship about the perpendicular axis 22, but axially fixed with respect to each other along the perpendicular axis 22 of the shaft 24.

The flexible circuit member 44 is then mounted, as represented at block 78, in the pivotally joined first and second housings 46, 48, with the first planar portion 46 of the circuit member 44 disposed in the first housing 14, and the second planar portion 48 of the circuit member 44 disposed in the second housing 18. The folded central portion of the web 50 is turned 90° so that it is generally coaxially oriented with respect to the perpendicular axis 22, and inserted into the annular cavity 36.

After placement of the flexible printed circuit member 44, in the joined housing 14, 18 the hinge cap 40 is then snapped downwardly over the upper end of the stub shaft 24 as indicated at block 80. The assembly of keypad assembly 10 is then completed, as represented by block 82, by installing the keys 20 and the upper portion of the housing 14, 18, as earlier described, in each of the lower portions of the housings 14, 18 of the keypad portions 12, 16.

Thus, it can be seen that the keypad assembly 10, embodying the present invention, is easily assembled in a vertical stack without lifting or turning the components over during assembly. Furthermore, while the keypad 10 is easily assembled manually, it is also readily adaptable to automated assembly, without the need for special tooling.

Thus, it can be seen that the present invention provides several important structural and functional advantages over relatively moveable circuits that are interconnected by separate cable assemblies, or which bend in a flexural mode about the axis of rotation. Importantly, the present invention provides a single flexible printed circuit member 44 having relatively moveable first and second portions 46, 48, rather than separate circuit members and interconnecting cables. The web portion 50 of the flexible printed circuit member 44 embodying the present invention is folded in such a way as to allow more circuit traces per volume through the hinge than with previous designs, and in such a way that it fits within a tightly compacted hinge. Furthermore, the present invention provides a strong, solid mechanical hinge between relatively moveable portions of the keypad assembly 10, and permits vertical assembly of the keypad 10 without having to feed a flexible circuit or wires through holes in the housing. Thus, the keypad assembly 10 embodying the present invention has improved manufacturability, lower assembly cost, increased reliability and lower internal electrical circuit resistance. Furthermore, the folds and bends in the flexible printed circuit member 44 allow plural electrical circuits to go through a hinge, even though the planar printed circuit portions 46, 48 are perpendicular to the hinge axis 22.

Although the present invention is described in terms of a preferred exemplary embodiment, with specific illustrative constructions of a flexible printed circuit member and folded arrangement of the interconnecting web, those skilled in the art will recognize the changes in those constructions and arrangements may be made without departing from the spirit of the invention. Such changes are intended to fall within the scope of the following claims. Other aspects, features and advantages of the present invention may be obtained from a study of this disclosure and the drawings, along with the appended claims.

What we claim is:

1. A flexible circuit member, comprising:
    a first planar portion disposed in a predefined plane;
    a second planar portion disposed in a plane parallel to said predefined plane and movable with respect to said first planar portion about an axis perpendicular to said predefined plane; and
    a web portion extending between said first and said second planar portions and having at least a portion thereof circumjacently disposed about said perpendicular axis in spaced relationship therefrom and in perpendicular relationship with said predefined plane.

2. A flexible circuit member, as set forth in claim 1, wherein said web portion has an elongated central portion having a length greater than its width, said elongated central portion of the web portion of the flexible circuit member being folded at least once along the length of said central portion.

3. A flexible circuit member, as set forth in claim 1, wherein said first planar portion and said second planar portion are coplanarly disposed in a common plane.

4. A flexible circuit member, as set forth in claim 1, wherein said first and second planar portions of the flexible printed circuit member are movable between a closed position at which said first and second planar portions of the flexible printed circuit member are adjacently disposed within said respective parallel planes and an open position at which said first and second planar portions are pivotally rotated within said respective parallel planes to a position away from said adjacent disposition, said web portion having an elongated central portion that is disposed about and in spaced relationship from said perpendicular axis at a first distance when said first and second planar portions are at said closed position and disposed about and spaced from said perpendicular axis at a second distance different from said first distance when said first and said second planar portions are at said open position.

5. A flexible circuit member, as set forth in claim 4, wherein second distance at which said elongated central portion of the web portion is spaced from said perpendicular axis is greater than said first distance.

6. A flexible circuit member, as set forth in claim 4, wherein second distance at which said elongated central portion of the web portion is spaced from said perpendicular axis is less than said first distance.

7. A flexible circuit member, as set forth in claim 1, wherein said first planar portion of the flexible printed circuit member is disposed within a first housing and said second planar portion is disposed within a second housing that is planarly rotatable with respect to said first housing about said axis perpendicular to the predefined plane, said second housing having a shaft perpendicular to the predefined plane and an outer cylindrical surface coaxially disposed about said axis.

8. A flexible circuit member, as set forth in claim 7, wherein said first housing includes an annular wall that is radially spaced outwardly from the outer cylindrical surface of the shaft of the second housing and is coaxially disposed with respect to said axis perpendicular to the predefined plane, said annular wall cooperating with the outer cylindrical surface of the shaft to at least partially define an annular cavity, and said elongated central portion of the web portion of the flexible circuit member being disposed within said annular cavity.

9. A flexible circuit member, as set forth in claim 1, wherein said first planar portion, said second planar portion and said web portion of the flexible printed circuit member each comprise a base layer having a plurality of electrically conductive circuit features disposed on a nonconductive flexible film.

10. A flexible circuit member, as set forth in claim 9, wherein said first and second planar potions of the web portion include a spacer layer formed of a nonconductive flexible film disposed over said base layer and an upper layer disposed over said spacer layer and having a plurality of key-actuatable switches disposed thereon.

11. A flexible circuit member, as set forth in claim 1, wherein said flexible printed circuit member is disposed within a telecommunication instrument.

12. The flexible circuit member of claim 1, wherein said first planar portion is disposed in a first housing having a first keypad portion mounted thereon, said second planar portion being disposed in a second housing having a second keypad portion mounted thereon, each of said housings being respectively disposed in a plane parallel with respect to each other and pivotally interconnected together for rotation about an axis perpendicular to the parallel planar disposition of the housings, said second housing having a shaft coaxially disposed with respect to said perpendicular axis and an outer cylindrical surface defined on said shaft, and said first housing having a circular opening coaxially disposed with respect to said perpendicular axis and adapted to rotatably mate with the outer cylindrical surface of said shaft of said second housing, said first housing also having an annular wall that is radially spaced from the outer cylindrical surface of the shaft and at least partially defining an annular cavity in coaxial alignment with said perpendicular axis, said web portion having at least a portion thereof disposed in said annular cavity, said first and second keypad portions combining to form a keypad assembly.

* * * * *